United States Patent [19]
Ishiyama

[11] Patent Number: 5,771,125
[45] Date of Patent: Jun. 23, 1998

[54] CATADIOPTRIC SYSTEM FOR PHOTOLITHOGRAPHY

[75] Inventor: Toshiro Ishiyama, Kawasaki, Japan

[73] Assignee: Nikon Corporation, Tokyo, Japan

[21] Appl. No.: 874,920

[22] Filed: Jun. 13, 1997

[30] Foreign Application Priority Data

Jun. 14, 1996 [JP] Japan .................................. 8-175922

[51] Int. Cl.$^6$ .................................................. G02B 17/08
[52] U.S. Cl. .......................................... 359/727; 359/730
[58] Field of Search .................................... 359/631, 633, 359/727, 730, 726

[56] References Cited

U.S. PATENT DOCUMENTS 5,402,267  3/1995  Furter et al. ............................ 359/727
5,694,241  12/1997 Ishiyama et al. ........................ 359/727

FOREIGN PATENT DOCUMENTS

WO 95/32446  11/1995  WIPO .

*Primary Examiner*—Scott J. Sugarman
*Attorney, Agent, or Firm*—Klarquist Sparkman Campbell Leigh & Whinston, LLP

[57] ABSTRACT

Catadioptric systems are disclosed for projecting images of an object such as a mask onto a substrate. The catadioptric systems have high numerical apertures and large working distances. The catadioptric systems are useful with short-wavelength illumination and permit the object and substrate to be in parallel planes. Conditional expressions are provided for the catadioptric systems.

20 Claims, 5 Drawing Sheets

CATADIOPTRIC SYSTEM FOR PHOTOLITHOGRAPHY

TECHNICAL FIELD OF THE INVENTION

The invention pertains to catadioptric optical systems for photolithography.

BACKGROUND OF THE INVENTION

Catadioptric systems (i.e., optical systems combining reflective and refractive optical elements) have been proposed for photolithographic systems for integrated circuit manufacturing. In order to produce complex integrated circuits, photolithographic systems must project high-resolution patterns from a mask onto a sensitized surface of a wafer. Short-wavelength illumination is frequently used to obtain high-resolution images, and catadioptric systems are especially appropriate with short-wavelength illumination. Catadioptric systems are also advantageous in that such systems can achieve high numerical apertures and therefore produce high levels of illumination, reducing the time required to expose a wafer.

Examples of conventional catadioptric systems are described in Japanese patent documents 66510 (1990), 235516 (1992), and 72478 (1993). Each of these conventional catadioptric systems has a beamsplitter that controls input and output of a light flux to and from a reflective portion of the catadioptric system. Each of the reflective portions of these conventional catadioptric systems has a concave mirror that demagnifies the mask. Because the concave mirror demagnifies, the magnification of the refractive portions of these conventional catadioptric systems placed imagewise of the reflective portions tends to be larger than the magnification of the concave mirror. As a result, an increase in image-side numerical aperture causes proportionally larger increases in beamsplitter diameter.

Another problem with conventional catadioptric systems is that the distance from the beamsplitter to the mask is short because of the demagnification of the concave mirror. Thus, the working distance (a distance between a most imagewise surface of the catadioptric system and the image plane on the wafer) is inconveniently small. A further problem is that image quality deteriorates because of the dependence of the beamsplitter's reflectance and transmittance on the angle of incidence with which the light flux strikes the beamsplitter.

SUMMARY OF THE INVENTION

The present invention provides catadioptric systems of high numerical aperture and large working distance that form high-resolution images. The object plane and image plane of these systems can be parallel, simplifying scanning systems necessary in scanning photolithography.

The catadioptric systems comprise, from objectwise to imagewise along an axis, a first lens group of positive refractive power, a second lens group with negative refractive power, a beamsplitter having a partially reflecting surface, a concave mirror with a magnification $\beta_{CM}$, and a third lens group with positive refractive power. The beamsplitter can be a beamsplitter cube. It is readily apparent that the partially reflecting surface of the beamsplitter is also partially transmitting.

A light flux from an illumination system illuminates a mask or analogous object. The light flux is transmitted by the first lens group to the second lens group. The beamsplitter receives the light flux from the second lens group and then directs the light flux to the concave mirror by either transmitting or reflecting the light flux. In the catadioptric system of FIG. 1, the beamsplitter transmits the light flux to the concave mirror. The concave mirror reflects the light flux back to the beamsplitter and the beamsplitter directs the light flux to the third lens group. It will be apparent that if the beamsplitter were configured to reflect the light flux from the second lens group to the concave mirror, the beamsplitter would correspondingly transmit the light flux to the third lens group. After transmission by the third lens group, the light flux forms an image of the mask on a plane parallel to a plane containing the mask; a wafer or other substrate is located in the plane parallel to the mask.

The catadioptric systems satisfy a Conditional Expression:

$$1.5 < L_1 < f_3$$

wherein $L_1$ is an axial distance between the most objectwise principal point of the third lens group and a most objectwise surface of the third lens group and $f_3$ is a focal length of the third lens group.

Some embodiments further comprise a folding mirror with a planar reflecting surface, placed between the first lens group and the second lens group. The folding mirror directs the light flux transmitted by the first lens group to the second lens group. The folding mirror, in conjunction with the beamsplitter, permits orienting the mask and the wafer in parallel planes, simplifying the scanning of the mask and the wafer. Even without the folding mirror, however, the catadioptric systems provide high-resolution imaging with high numerical aperture and long working distance. A gap between the first lens group and the second lens group provides space for the folding mirror. In prior art systems, such a gap causes the beamsplitter and the concave mirror to become larger.

The following conditional expressions are provided, that when satisfied, keep the beamsplitter and the concave mirror compact while maintaining high image-side numerical aperture and long working distance with high-resolution imaging:

$$-20.0 < \beta_1/\beta < -1.0$$

$$-1.0 < \beta_3/\beta < 1.0$$

$$-1.0 < 1/\beta_{CM} < 0.5$$

$$5.0 < D_{12}/(NA_i \cdot Y_0) < 50.0$$

$$0.7 < (T_2 \cdot NA_i)/f_3$$

$$(\phi_B^{1/2} - 4 \cdot d_w \cdot NA_i)/(f_3 \cdot NA_i^2) < 4.0$$

$$-2.0 < f_2/f_1 < -0.2$$

wherein $\beta$ is a magnification of the catadioptric system; $\beta_1$ is a magnification of the first lens group; $\beta_3$ is a magnification of the third lens group; $D_{12}$ is an axial distance between a most imagewise surface of the first lens group and a most objectwise surface of the second lens group; $NA_i$ is an image-side numerical aperture; $Y_0$ is a maximum image height; $T_2$ is an air-equivalent axial distance between a most imagewise surface of the beamsplitter and the image surface; $\phi_B$ is an area represented by an orthographic projection, onto the partially reflecting surface of the beamsplitter, of the beamsplitter's most imagewise surface that is illuminated by the light flux; $d_w$ is an axial distance between a most imagewise surface of the third lens group and the image; $f_1$ is a focal length of the first lens group; and $f_2$ is a focal length of the second lens group.

Some embodiments comprise an aperture placed between a most imagewise surface of the beamsplitter and the image wherein $T_1$ is an air-equivalent axial distance between the concave mirror and the aperture and $f_{CM}$ is a focal length of the concave mirror, and satisfying the Conditional Expression:

$$0.26 < T_1/f_{CM} < 1.0$$

Some embodiments further provide that a refractive power of all optical elements between the beamsplitter and the concave mirror is zero.

The foregoing and other objects, features, and advantages of the invention will become more apparent from the following detailed description of a preferred embodiment which proceeds with reference to the accompanying drawings.

DETAILED DESCRIPTION

In describing the following Example Embodiments, a straight line or a series of line segments through centers of curvature of optical elements is termed an "axis." As will be readily understood, in a system of optical elements containing folding mirrors, an axis bends at a folding mirror. Directions and distances are referred to as "imagewise" when toward an image and "objectwise" when toward an object with reference to an axis. In describing the Example Embodiments, an image is generally projected onto a wafer, but other substrates are possible, such as glass panels for liquid crystal panels. Similarly, an "object" is generally a mask containing patterns for integrated circuits, but it will be appreciated that the invention is applicable to other objects.

Figure 1:
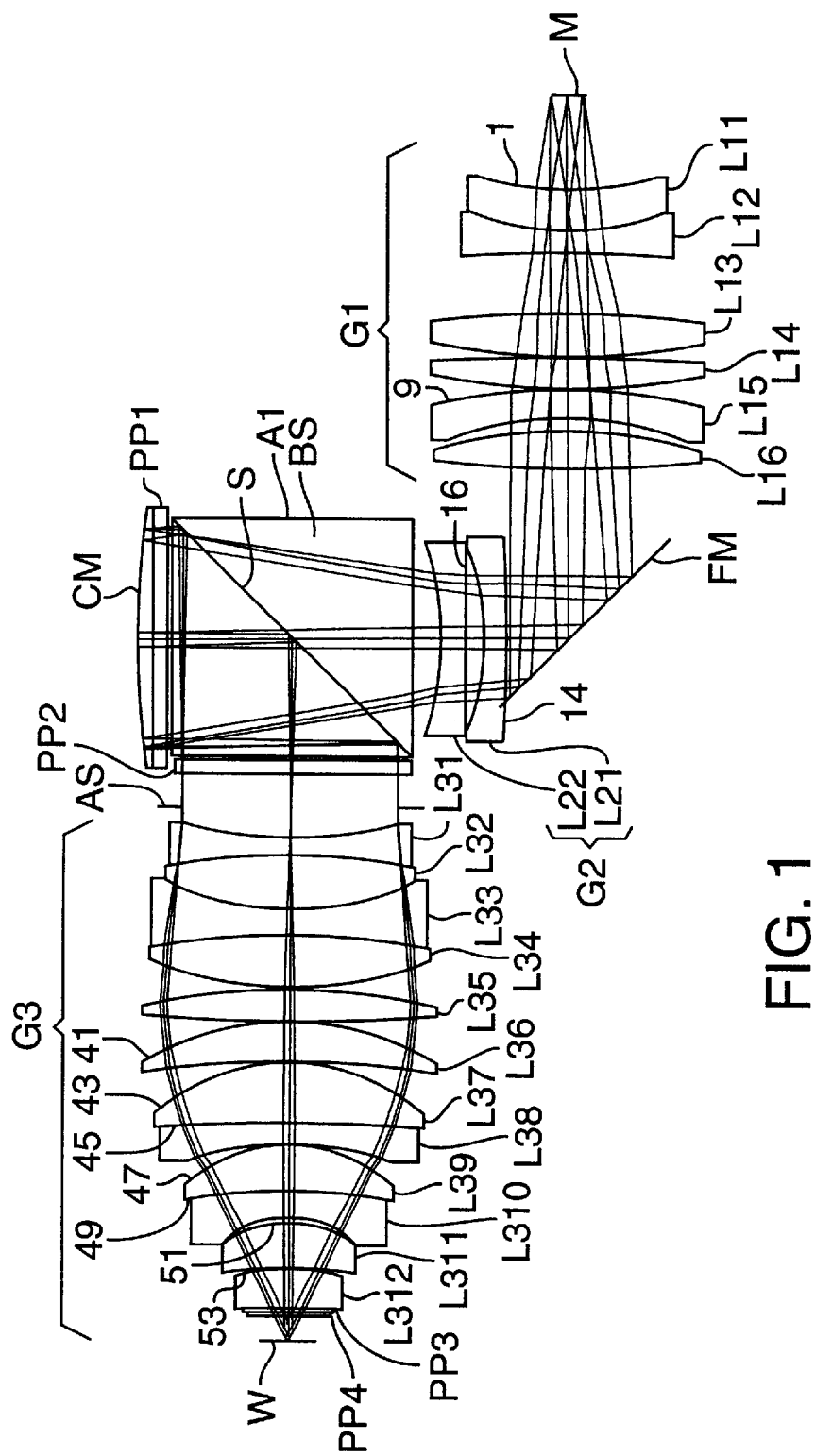
FIG. 1 is an optical diagram showing certain general features of catadioptric systems according to the present invention, as well as features specific to Example Embodiment 1.

With reference to FIG. 1, catadioptric systems according to the present invention generally comprise, from objectwise to imagewise along an axis, a first lens group G1 of positive refractive power, a folding mirror FM with a planar reflecting surface, a second lens group G2 with negative refractive power, a beamsplitter BS having a partially reflecting surface S, a concave mirror CM with a magnification $\beta_{CM}$, and a third lens group G3 with positive refractive power.

A light flux from an illumination system (not shown in FIG. 1, but located upstream of the mask M) illuminates the mask M or analogous object. The light flux is transmitted by the first lens group G1, reflected by the folding mirror FM, and transmitted by the second lens group G2. The beamsplitter BS receives the light flux from the second lens group G2 and then directs the light flux to the concave mirror CM by either transmitting or reflecting the light flux. In the catadioptric system of FIG. 1, the beamsplitter BS transmits the light flux to the concave mirror CM. The concave mirror CM reflects the light flux back to the beamsplitter BS and the beamsplitter BS directs the light flux to the third lens group G3. It will be apparent that if the beamsplitter BS were configured to reflect the light flux from the second lens group G2 to the concave mirror CM, the beamsplitter BS would correspondingly transmit the light flux to the third lens group G3. After transmission by the third lens group G3, the light flux forms an image of the mask M on a plane parallel to a plane containing the mask M; a wafer W or other substrate is located in the plane parallel to the mask M.

The folding mirror FM, in conjunction with the beamsplitter BS, permits orienting the mask M and the wafer W in parallel planes, simplifying the scanning of the mask M and the wafer W. Even without the folding mirror FM, however, the catadioptric systems provide high-resolution imaging with high numerical aperture and long working distance.

A gap between the first lens group G1 and the second lens group G2 provides space for the folding mirror FM. In prior-art systems, such a gap causes the beamsplitter BS and the concave mirror CM to become larger.

Conditional expressions are set forth below that, when satisfied, keep the beamsplitter BS and the concave mirror CM compact while maintaining high image-side numerical aperture and long working distance with high-resolution imaging.

The catadioptric systems preferably satisfy the following conditional expression 1, wherein $L_1$ is an axial distance between a most objectwise principal point of the third lens group G3 and a most objectwise surface of the third lens group G3 wherein the most objectwise principal point of the third lens group G3 is objectwise of the third lens group G3, and $f_3$ is a focal length of the third lens group G3.

$$1.5 < L_1/f_3 \tag{1}$$

Conditional expression 1 pertains to the third lens group G3. If conditional expression 1 is not satisfied, then the size of the beamsplitter BS increases and the working distance decreases. A more advantageous lower limit for conditional expression 1 is 2.0 instead of 1.5.

The catadioptric systems also preferably satisfy conditional expressions 2 and 3 below, in which $\beta_{CM}$ is a magnification produced by the concave mirror CM, $D_{12}$ is an axial distance between a most imagewise surface of the first lens group G1 and a most objectwise surface of the second lens group G2, $NA_i$ is an image-side numerical aperture of the catadioptric system, and $Y_0$ is a maximum image height.

$$-1.0 < 1/\beta_{CM} < 0.5 \tag{2}$$

$$5.0 < D_{12}/(NA_i Y_0) < 50.0 \tag{3}$$

Conditional expression 2 defines a range for the magnification $\beta_{CM}$ of the concave mirror CM. If the lower limit of Conditional Expression 2 is violated, the refractive power of the third lens group G3 is too small and it is difficult to achieve a high numerical aperture and long working distance; also, the beamsplitter BS is excessively large. In addition, the light flux incident to the beamsplitter BS has an increased range of angles of incidence on the beamsplitter BS; therefore, variations in the reflectance of the beamsplitter with angle of incidence become significant, decreasing image quality. A lower limit of −0.5 instead of −1.0 is preferable.

If the upper limit of conditional expression 2 is exceeded, then the positive refractive power of the concave mirror CM is too small. An additional lens system would then be required to provide additional positive refractive power. As a result, chromatic aberration and monochromatic aberrations, including Petzval sum, are difficult to correct. Therefore, 0.2 is a preferable upper limit in conditional expression 2.

Satisfying conditional expression 3 permits the catadioptric system to have the mask M (i.e., the object) and the wafer W (i.e., the image) in parallel planes. A gap is required between the lens groups G1 and G3 to provide space for the folding mirror FM. The size of the gap depends primarily on the object size and the numerical aperture.

If the lower limit of conditional expression 3 is violated, then the gap between the first lens group G1 and the second lens group G3 becomes too small for the folding mirror FM and without the folding mirror FM the wafer W and mask M cannot be in parallel planes. A lower limit value of 10.0 is preferable to the limit value of 5.0.

If the upper limit of conditional expression 3 is violated, then the size of the beamsplitter BS is too large. An upper limit of 30.0 is more preferable than the upper limit of 50 in Conditional Expression 3.

The beamsplitter BS is preferably a polarizing beamsplitter that separates orthogonal polarizations. If the beamsplitter BS is a polarizing beamsplitter and a linearly polarized light flux is incident on the beamsplitter BS from the folding mirror FM, a quarter-wave retarder between the beamsplitter BS and the concave mirror CM causes the light flux reflected by the concave mirror CM to the beamsplitter BS to be directed toward the image and no portion of the light flux returns toward the second lens group G2. Thus, using a polarizing beamsplitter reduces light flux lost by propagation back toward the second lens group G2 and increases image contrast.

In addition, it is advantageous that the following conditional expression 4 be satisfied. Defining β as a magnification of the entire catadioptric system and $\beta_1$ as a magnification of the first lens group G1, conditional expression 4 is as follows:

$$-20.0 < \beta_1/\beta < -1.0 \tag{4}$$

Conditional expression 4 defines a range of magnification for the first lens group G1. If the lower limit of conditional expression 4 is violated, then the concave mirror CM has too little positive power and an additional lens group with positive power is necessary. As a result, both monochromatic aberrations (e.g., Petzval sum) and chromatic aberration are difficult to correct. If the upper limit of conditional expression 4 is exceeded, then the beamsplitter BS increases in size. The folding mirror FM also increases in size and is likely to interfere with the first lens group G1 and the second lens group G2.

In addition, it is preferable that conditional expression 5 below be satisfied, wherein $\beta_3$ is a magnification of the third lens group G3:

$$-1.0 < \beta_3/\beta < 1.0 \tag{5}$$

Conditional expression 5 defines a suitable range for the magnification of the third lens group G3. If the lower limit of conditional expression 4 is violated, then the size of the beamsplitter BS increases. If the upper limit of conditional expression 5 is exceeded, then the positive power of the concave mirror CM is too small thereby requiring an additional lens system to supply additional positive refractive power. As a result, correction of both monochromatic aberrations (e.g., Petzval's sum) and chromatic aberrations is difficult.

To avoid astigmatism or coma in the catadioptric systems of the present invention, the beamsplitter BS is preferably a beamsplitter cube. It is also preferable that an aperture AS be provided between a most-imagewise surface of the beamsplitter BS and the image, and that conditional expression 6 be satisfied:

$$0.26 < T_1/f_{CM} < 1.0 \tag{6}$$

In conditional expression 6, $T_1$ is an air-equivalent axial distance corresponding to an axial distance between the concave mirror CM and the aperture AS; $f_{CM}$ is a focal length of the concave mirror CM. An air-equivalent axial distance $d_{air}$ of a series of materials of thickness $t_i$ and refractive index $n_i$ is calculated as shown by Equation A:

$$d_{air} = \sum_i \frac{d_i}{n_i} \tag{A}$$

Conditional expression 6 determines the placement of the aperture stop AS. If the lower limit of conditional expression 6 is violated, then either the aperture AS moves too close to the concave mirror CM or the focal length $f_{CM}$ of the concave mirror CM is too long. As a result, the beamsplitter BS is too large. If the upper limit of conditional expression 6 is exceeded, then correction of off-axis aberrations, especially coma, is difficult.

In addition, it is preferable for conditional expression 7 to be satisfied:

$$0.7 < (T_2 \cdot NA_i)/f_3 \tag{7}$$

$T_2$ is an air-equivalent axial distance corresponding to a distance between a most imagewise surface of the beamsplitter BS and the image. Conditional expression 7 defines a range for a space between the most-imagewise surface of the beamsplitter BS and the image surface.

If the lower limit of conditional expression 7 is violated, then either the working distance is too small or the number of elements in the third lens group G3 is too limited, making aberration correction difficult. Furthermore, in order to reduce the size of the beamsplitter cube BS while providing a high numerical aperture and a long working distance, the lower limit of conditional expression 7 is preferably 3.5 instead of 0.7.

In addition, it is preferable that conditional expression 8 be satisfied:

$$[\phi_B^{1/2} - (4 \cdot d_w \cdot NA_i)]/(f_3 \cdot NA_i^2) < 4.0 \tag{8}$$

In conditional expression (8), $\phi_B$ is an area represented by an orthographic projection, onto the partially reflecting surface of the beamsplitter BS, of the beamsplitter's most imagewise surface that is illuminated by the light flux. Also, $d_w$ is the working distance, i.e., the distance along the axis between the image plane and the most imagewise surface of the third lens group G3.

Conditional expression 8 defines a range for the focal length $f_3$ of the third lens group G3 with respect to image-side numerical aperture $NA_i$, the working distance $d_w$, and the aperture AS of the beamsplitter BS. If the upper limit of conditional expression 8 is exceeded, then the third lens group G3 has too much positive power thereby reducing the positive power of the concave mirror CM. As a result, it is difficult to correct chromatic aberrations as well as monochromatic aberrations such as Petzval's sum. An upper limit of 3.5 is preferable to the upper limit of 4.0.

The catadioptric systems of the present invention are suitable for photolithographic systems that expose sensitized surfaces to short-wavelength light fluxes that have a center wavelength of less than 300 nm and a spectral bandwidth about the center wavelength. When such light fluxes are used, the first lens group G1 and the third lens group G3 comprise refractive elements made of two or more optical materials. In particular, the first lens group G1 preferably comprises a negative lens component of fluorite and the third lens group G3 comprises a positive lens component of fluorite. This permits simultaneous correction of axial chromatic aberration and chromatic difference of magnifications (lateral color) and allows high-resolution imaging even with wide spectral bandwidth light fluxes.

Normally, if the positive refractive power of the first lens group G1 is large, the positive refractive power of the concave mirror CM tends to be small. The Petzval's sum then tends be large and positive and the advantageous properties of the concave mirror CM are diminished. Therefore, to provide high-resolution imaging with an adequate gap for the folding mirror FM, it is preferable to satisfy conditional expression 9:

$$-2.0 < f_2/f_1 < -0.2 \qquad (9)$$

wherein $f_1$ is a focal length of the first lens group G1 and $f_2$ is a focal length of the second lens group G2.

If the lower limit of conditional expression 9 is violated, then the beamsplitter is too large. Additionally, the positive power of the concave mirror CM must increase or the positive power of the third lens group G3 must increase relative to the increased negative power of the second lens group G2. As a result, coma and other aberrations become unacceptable.

Moreover, to reduce image-quality degradation due to the dependence of the reflectance of the beamsplitter BS on angles of incidence of the light flux, it is preferable that the light flux between the beamsplitter BS and the third lens group G3 be collimated.

When using the catadioptric systems of the invention for projection in a scanning photolithography system, a rectangular exposure field on the wafer W is generally used. The rectangular exposure field usually has a length perpendicular to a scan direction longer than a width parallel to the scan direction. The folding mirror FM and the beamsplitter BS are preferably oriented such that the light flux reflects from planar surfaces parallel to the length of the rectangular exposure field in order to keep the beamsplitter BS compact and provide a sufficient gap for the folding mirror FM.

It is even more preferable for the space between the beamsplitter BS and the concave mirror CM to have a refractive power of zero. This means that the space between the beamsplitter BS and the concave mirror CM is either empty or contains elements with zero power such as plane-parallel plates. In conventional catadioptric systems, a negative lens is placed between the beamsplitter and the concave mirror and the beamsplitter is large. If a somewhat larger beamsplitter BS can be tolerated, an aberration-correcting optical group can be added between the beamsplitter BS and the concave mirror CM.

EXAMPLE EMBODIMENT 1

With reference to FIG. 1, a catadioptric system according to Example Embodiment 1 receives a light flux from an illumination system, not shown in FIG. 1, but located upstream of the mask M. The light is transmitted by the mask M. The light flux transmitted by the mask M proceeds along an axis to a first lens group G1 and is reflected by a folding mirror FM to a second lens group G2. A beamsplitter BS transmits the light flux received from the second lens group G2 to a first parallel plate PP1 and a concave mirror CM. The concave mirror CM reflects the light flux from the first parallel plate PP1 back to the beamsplitter BS which then reflects the light flux through, in order, a second parallel plate PP2, an aperture stop AS, a third lens group G3, a third parallel plate PP3, and a fourth parallel plate PP4. An image of the mask M is then formed on a sensitized surface of a wafer W.

The first lens group G1 comprises, from objectwise to imagewise, a positive meniscus lens L11 with a concave surface 1 facing objectwise, a biconcave lens L12, a biconvex lens L13, a biconvex lens L14, a negative meniscus lens L15 with a convex surface 9 facing objectwise, and a biconvex lens L16.

The second lens group G2 comprises, from objectwise to imagewise, a negative meniscus lens L21 with a convex surface 14 facing objectwise and a negative meniscus lens L22 with a convex surface 16 facing objectwise.

The third lens group G3 comprises, from objectwise to imagewise, a biconcave lens L31, a biconvex lens L32, a biconcave lens L33, a biconvex lens L34, a biconvex lens L35, a positive meniscus lens L36 with a convex surface 41 facing objectwise, a positive meniscus lens L37 with a convex surface 43 facing objectwise, a negative meniscus lens L38 with a convex surface 45 facing objectwise, a positive meniscus lens L39 with a convex surface 47 facing objectwise side, a negative meniscus lens L310 with a convex surface 49 facing objectwise, a positive meniscus lens L311 with a convex surface 51 facing objectwise, and a positive meniscus lens L312 with a convex surface 53 facing objectwise.

The parallel plate PP1 is situated between the beamsplitter BS and the concave mirror CM. When the beamsplitter BS is a polarizing beamsplitter, the parallel plate PP1 can be a quarter-wave retarder or a support plate. The parallel plates PP3 and PP4 are adjusted during manufacture to remove aberrations.

The beamsplitter BS preferably comprises two right-angle prisms cemented to each other, forming a beamsplitter cube. The beamsplitter BS has a partially reflecting surface S that transmits light received from the second lens group G2 and reflects the light received from the concave mirror CM. A thin film optical coating is deposited on the partially reflecting surface S and the reflectance of the partially reflecting surface S depends upon the properties of this thin film optical coating.

In a variation of Example Embodiment 1, the partially reflecting surface S is prepared to reflect light received from the second lens group G2 and transmit light received from the concave mirror CM. In this variation, the third lens group G3 receives light from the concave mirror CM transmitted by the beamsplitter BS; the concave mirror CM and the first parallel plate PP1 are then arranged near a surface A1 of the beamsplitter BS.

In Example Embodiment 1, the illumination system can illuminate a rectangular illumination region of the mask M.

Each illuminated region can be arranged, for example, in an array of 30 rows by 6 columns. The beamsplitter BS used in such a situation is a rectangular solid of square cross-section 180 mm by 180 mm in the plane of FIG. 1 and 204 mm long perpendicular to FIG. 1.

Table 1 contains specifications for Example Embodiment 1. In Table 1, $d_0$ is a distance along the axis between the mask M and a most objectwise surface of the lens L11. Surface numbers in Table 1 are in order from objectwise to imagewise, following the light flux from the mask M to the wafer W. The radii of curvature of the surfaces are r, and d is the separation of adjacent surfaces measured along the axis.

Sign conventions for the radii of curvature and separations are as follows. Between the mask and the folding mirror FM, a radius of curvature r is positive for a convex surface facing objectwise. Between the concave mirror CM and the folding mirror FM, a radius of curvature is positive for a convex surface facing the concave mirror CM. Between the beamsplitter BS and the wafer (i.e., the image), a convex surface facing imagewise is positive. Distances d are negative between the folding mirror FM and the concave mirror CM. From the partially reflecting surface S of the beamsplitter BS to the image surface, distances are negative. Elsewhere, distances are positive.

In Example Embodiment 1, fluorite and fused quartz are used as the optical materials. In Table 1, the refractive indices and dispersions of fluorite ($n_c$, $v_c$) and fused quartz ($n_s$, $v_s$), respectively, are given for a reference wavelength $\lambda$=193.4 nm (i.e., the wavelength of an ArF excimer laser) wherein the dispersion values are calculated for a wavelength range of 193.4 nm±0.1 nm.

TABLE 1

(Example Embodiment 1)

General Specifications $\beta$ = -0.25
$NA_i$ = 0.6
$d_0$ = 69.317 mm
$n_s$ = 1.56019 (fused quartz)
$n_c$ = 1.50138 (fluorite)
$v_s$ = 1780 (fused quartz)
$v_c$ = 2550 (fluorite)

Surface Specifications

| Surface No. | r (mm) | d (mm) | Material and Element No. |
|---|---|---|---|
| 1 | -241.215 | 30.210 | Fused Quartz (L11) |
| 2 | -192.915 | 0.992 | |
| 3 | -203.766 | 18.190 | Fluorite (L12) |
| 4 | 888.211 | 44.298 | |
| 5 | 1065.344 | 33.409 | Quartz (L13) |
| 6 | -432.641 | 0.500 | |
| 7 | 2789.031 | 25.000 | Fused Quartz (L14) |
| 8 | -473.262 | 0.500 | |
| 9 | 475.495 | 22.000 | Fused Quartz (L15) |
| 10 | 301.189 | 8.463 | |
| 11 | 412.538 | 27.926 | Fused Quartz (L16) |
| 12 | -861.774 | 130.000 | |
| 13 | ∞ | -50.075 | (FM) |
| 14 | -838.940 | -17.871 | Fluorite (L21) |
| 15 | -214.860 | -11.842 | |
| 16 | -2242.134 | -20.000 | Fused Quartz (L22) |
| 17 | -208.410 | -25.000 | |
| 18 | ∞ | -180.000 | (BS) |
| 19 | ∞ | -2.000 | |
| 20 | ∞ | -12.000 | Fused Quartz (PP1) |
| 21 | ∞ | -10.000 | |

TABLE 1-continued (Example Embodiment 1)

| | | | |
|---|---|---|---|
| 22 | 699.953 | 10.000 | (CM) |
| 23 | ∞ | 12.000 | Fused Quartz (PP1) |
| 24 | ∞ | 2.000 | |
| 25 | ∞ | 90.000 | (BS) |
| 26 | ∞ | -90.000 | (BS, partially reflecting surface S) |
| 27 | ∞ | -2.000 | |
| 28 | ∞ | -10.000 | (PP2) |
| 29 | ∞ | -25.000 | |
| 30 | ∞ | -25.000 | (AS) |
| 31 | 294.701 | -15.000 | Fused Quartz (L31) |
| 32 | -617.167 | -0.500 | |
| 33 | -610.392 | -40.411 | Fluorite (L32) |
| 34 | 177.447 | -0.850 | |
| 35 | 175.279 | -17.000 | Fused Quartz (L33) |
| 36 | -432.375 | -2.395 | |
| 37 | -515.718 | -41.031 | Fluorite (L34) |
| 38 | 249.959 | -0.500 | |
| 39 | -540.929 | -25.465 | Fluorite (L35) |
| 40 | 1034.968 | -0.500 | |
| 41 | -225.345 | -30.014 | Fluorite (L36) |
| 42 | -870.019 | -0.503 | |
| 43 | -157.845 | -44.222 | Fluorite (L37) |
| 44 | -1273.530 | -0.500 | |
| 45 | -1267.133 | -18.000 | Fused Quartz (L38) |
| 46 | -342.866 | -0.500 | |
| 47 | -128.815 | -36.728 | Fluorite (L39) |
| 48 | -1917.391 | -0.728 | |
| 49 | -2288.628 | -15.129 | Fused Quartz (L310) |
| 50 | -74.280 | -6.241 | |
| 51 | -94.414 | -35.270 | Fluorite (L311) |
| 52 | -332.716 | -5.000 | |
| 53 | -197.634 | -27.127 | Fused Quartz (L312) |
| 54 | -560.290 | -1.000 | |
| 55 | ∞ | -3.000 | Fused Quartz (PP3) |
| 56 | ∞ | -1.000 | |
| 57 | ∞ | -3.000 | Fused Quartz (PP4) |
| 58 | ∞ | -16.000 | |

Values of Conditional Expressions

| | | |
|---|---|---|
| (1) | $L_1/f_3$ = | 2.263 |
| (2) | $1/\beta_{CM}$ = | -0.012 |
| (3) | $D_{12}/(NA_i \cdot Y_0)$ = | 19.620 |
| (4) | $\beta_1/\beta$ = | -12.665 |
| (5) | $\beta_3/\beta$ = | -0.018 |
| (6) | $T_1/f_{CM}$ = | 0.481 |
| (7) | $(T2 \cdot NA_i)/f_3$ = | 1.452 |
| (8) | $(\phi_B^{1/2} - 4 \cdot d_W \cdot NA_i)/(f_3 \cdot NA_i^2)$ = | 3.202 |
| (9) | $f_2/f_1$ = | -0.704 |

Figure 2A:
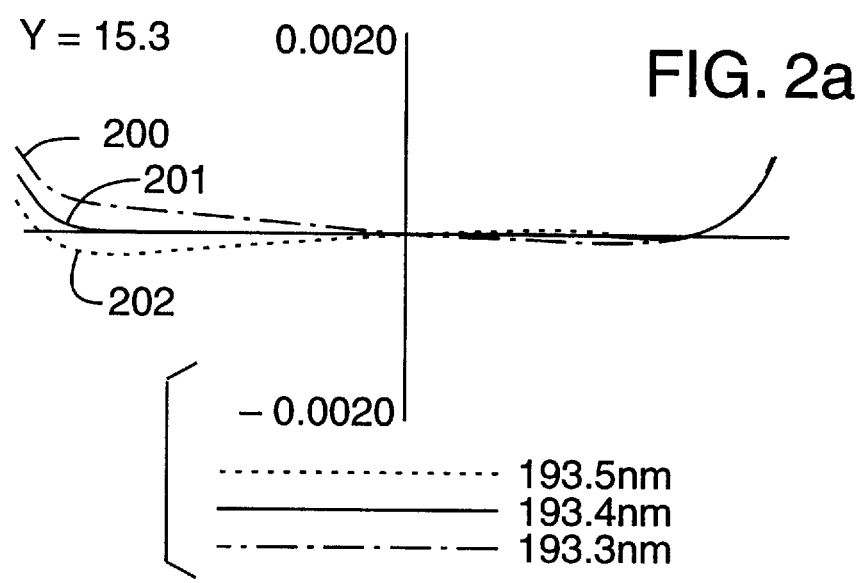
FIG. 2(a) contains graphs of transverse aberrations for an object point 15.3 mm from an axis of the catadioptric system of Example Embodiment 1, plotted for wavelengths of 193.3 nm, 193.4 nm, and 194.5 mm.
Figure 2B:
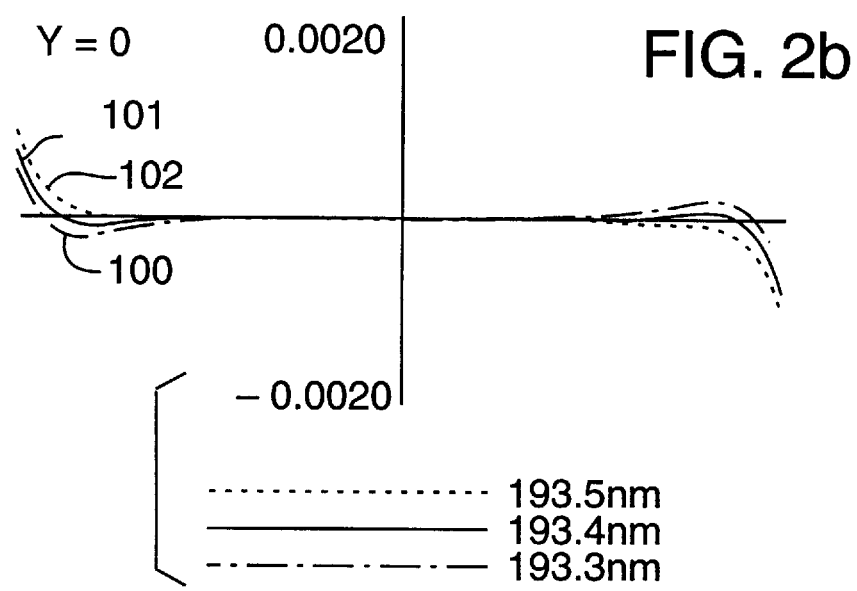
FIG. 2(b) contains graphs of transverse aberrations for an on-axis object point for the catadioptric system of Example Embodiment 1, plotted for wavelengths of 193.3 nm, 193.4 nm, and 193.5 nm.

FIG. 2(b) depicts transverse aberration curves 100, 101, 102 for an on-axis image point and FIG. 2(a) depicts transverse aberration curves 200, 201, 202 for an image point at Y=15.3 mm from the axis, plotted at wavelengths of 193.3 nm, 193.4 nm, and 193.5 nm, respectively. It is readily apparent that the aberrations of the catadioptric system of Example Embodiment 1 are well-corrected even though the catadioptric system has an image-side numerical aperture $NA_i$=0.6 and a long working distance. In particular, chromatic aberration is well-corrected within the wavelength range 193.4nm ±0.1 nm.

EXAMPLE EMBODIMENT 2

Figure 3:
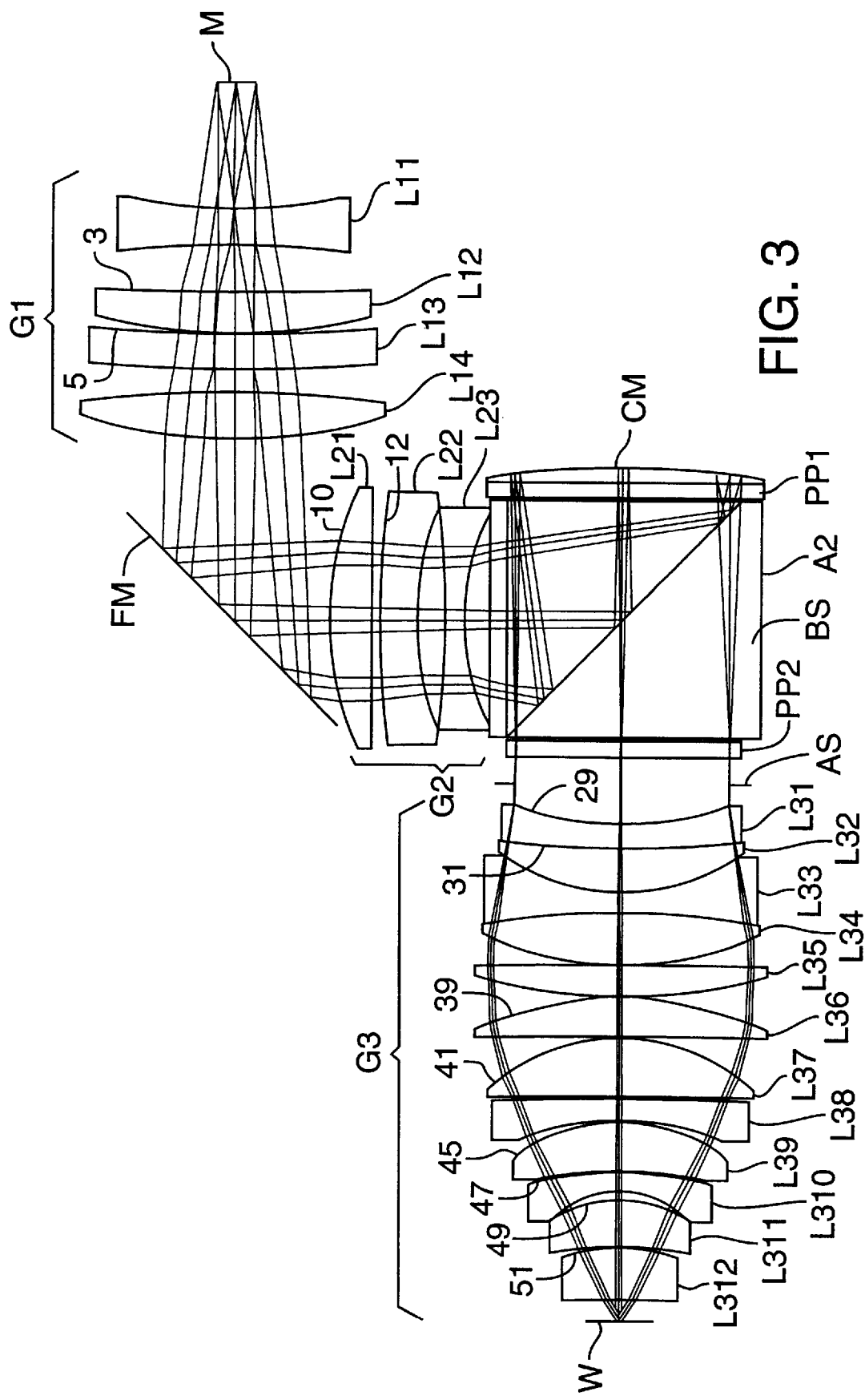
FIG. 3 is an optical diagram of a catadioptric system according to Example Embodiment 2.

With reference to FIG. 3, a catadioptric system according to Example Embodiment 2 receives a light flux from an illumination system, not shown in FIG. 3 but situated upstream of the mask M. The light flux is transmitted by the mask M to a first lens group G1 and is reflected by a folding mirror FM to a second lens group G2. A beamsplitter BS reflects the light flux received from the second lens group G2 to a first parallel plate PP1 and a concave mirror CM. The concave mirror CM reflects the light flux from the first parallel plate PP1 back to the beamsplitter BS which then transmits the light through, in order, a second parallel plate PP2, an aperture AS, and a third lens group G3. An image of the mask M is formed on a wafer W.

The first lens group G1 comprises, from objectwise to imagewise, a biconcave lens L11, a positive meniscus lens L12 with a concave surface 3 facing objectwise, a negative meniscus lens L13 with a concave surface 5 facing objectwise, and a biconvex lens L14.

The second lens group G2 comprises, from objectwise to imagewise, a positive meniscus lens L21 with a convex surface 10 facing objectwise, a negative meniscus lens L22 with a convex surface 12 facing objectwise, and a biconcave lens L23.

The third lens group G3 comprises, from objectwise to imagewise, a negative meniscus lens L31 with a concave surface 29 facing objectwise, a positive meniscus lens L32 with a concave surface 31 facing objectwise, a biconcave lens L33, a biconvex lens L34, a biconvex lens L35, a positive meniscus lens L36 with a convex surface 39 facing objectwise, a positive meniscus lens L37 with a convex surface 41 facing objectwise, a biconcave lens L38, a positive meniscus lens L39 with a convex surface 45 facing objectwise, a negative meniscus lens L310 with a convex surface 47 facing objectwise, a positive meniscus lens L311 with a convex surface 49 facing objectwise, and a positive meniscus lens L312 with a convex surface 51 facing objectwise.

A parallel plate PP1 is situated between the beamsplitter BS and the concave mirror CM. When the beamsplitter BS is a polarizing beamsplitter and the parallel plate PP1 is an appropriately aligned quarter-wave retarder, light reflected by the beamsplitter BS to the concave mirror CM can be efficiently transmitted by the beamsplitter to the second parallel plate PP2.

The parallel plate PP2 is preferably placed between the beamsplitter BS and the third lens group G3. The parallel plate PP2 used to remove aberrations during the manufacturing process.

The beamsplitter BS of Example Embodiment 2 is similar to the beamsplitter BS of Example Embodiment 1. It will be apparent that the concave mirror CM can also be placed near the surface A2 of the beamsplitter BS. In this case, the beamsplitter BS transmits the light flux incident to the beamsplitter to the concave mirror CM; after reflection from the concave mirror CM, the beamsplitter BS reflects the light flux to the third lens group G3.

In Example Embodiment 2, the illumination system can illuminate illumination regions on the mask as in Example Embodiment 1. Similarly, the beamsplitter BS can be a rectangular solid of square cross-section 170 mm by 170 mm and 204 mm long in a direction perpendicular to the plane of FIG. 3.

Table 2 contains specifications for the catadioptric system of Example Embodiment 2. Variable definitions and surface numbering are the same as given previously. As will be apparent from Table 2 and FIG. 3, sign conventions for radii of curvature and distances are similar to those used in Table 1. For convenience, Table 3 contains the refractive indices and dispersions for fused quartz and fluorite at a wavelength of $\lambda$=193.4 nm (wavelength of ArF excimer laser) for a ±0.1 nm wavelength range.

TABLE 2

General Specifications $\beta = -0.25$
$NA_i = 0.6$
$d_0 = 90.000$ mm
$n_s = 1.56019$ (fused quartz)
$n_c = 1.50138$ (fluorite)
$v_s = 1780$ (fused quartz)
$v_c = 2550$ (fluorite)

Surface Specifications

| Surface No. | r (mm) | d (mm) | Optical Material |
|---|---|---|---|
| 1 | −411.733 | 27.000 | Fused Quartz (L11) |
| 2 | 656.617 | 31.742 | |
| 3 | −3741.142 | 32.000 | Fused Quartz (L12) |
| 4 | −354.176 | 0.503 | |
| 5 | −764.495 | 25.000 | Fluorite (L13) |
| 6 | −984.019 | 16.283 | |
| 7 | 944.330 | 35.000 | Fused Quartz (L14) |
| 8 | −311.518 | 130.000 | |
| 9 | ∞ | 70.051 | (FM) |
| 10 | −220.080 | −30.000 | Fused Quartz (L21) |
| 11 | −12028.477 | −6.273 | |
| 12 | −792.911 | −25.000 | Fluorite (L22) |
| 13 | −182.584 | −21.779 | |
| 14 | 637.333 | −15.000 | Fused Quartz (L23) |
| 15 | −192.509 | −30.000 | |
| 16 | ∞ | −85.000 | (BS, partially reflecting surface S) |
| 17 | ∞ | 85.000 | (BS) |
| 18 | ∞ | 2.000 | |
| 19 | ∞ | 12.000 | Fluorite (PP1) |
| 20 | ∞ | 10.000 | |
| 21 | −667.900 | −10.000 | (CM) |
| 22 | ∞ | −12.000 | Fused Quartz (PP1) |
| 23 | ∞ | −2.000 | |
| 24 | ∞ | −170.000 | (BS) |
| 25 | ∞ | −2.000 | |
| 26 | ∞ | −12.000 | Fused Quartz (PP2) |
| 27 | ∞ | −20.000 | |
| 28 | ∞ | −30.000 | (AS) |
| 29 | 212.978 | −15.000 | Fused Quartz (L31) |
| 30 | 1823.089 | −0.500 | |
| 31 | 1971.531 | −31.131 | Fluorite (L32) |
| 32 | 154.948 | −0.651 | |
| 33 | 154.191 | −15.000 | Fused Quartz (L33) |
| 34 | −570.342 | −1.857 | |
| 35 | −683.896 | −35.283 | Fluorite (L34) |
| 36 | 240.387 | −0.500 | |
| 37 | −3549.019 | −23.137 | Fluorite (L35) |
| 38 | 372.821 | −0.500 | |
| 39 | −250.881 | −28.475 | Fluorite (L36) |
| 40 | −5813.500 | −0.500 | |
| 41 | −143.799 | −42.816 | Fluorite (L37) |
| 42 | −18731.560 | −1.471 | |
| 43 | 5653.732 | −15.000 | Fused Quartz (L38) |
| 44 | −212.945 | −0.500 | |
| 45 | −120.884 | −37.292 | Fluorite (L39) |
| 46 | −353.658 | −0.500 | |
| 47 | −266.801 | −15.140 | Fused Quartz (L310) |
| 48 | −72.574 | −5.818 | |
| 49 | −90.591 | −34.587 | Fluorite (L311) |
| 50 | −278.105 | −0.500 | |
| 51 | −186.822 | −36.761 | Fused Quartz (L312) |
| 52 | −635.651 | −15.000 | |

Values of Conditional Expressions

| | | |
|---|---|---|
| (1) | $L_1/f_3 =$ | 2.213 |
| (2) | $1/\beta_{CM} =$ | −0.114 |
| (3) | $D_{12}/(NA_i \cdot Y_0) =$ | 21.796 |
| (4) | $\beta_1/\beta =$ | −8.919 |
| (5) | $\beta_3/\beta =$ | −0.166 |
| (6) | $T_1/f_{CM} =$ | 0.474 |

TABLE 2-continued

| (7) | $(T_2 \cdot NA_i)/f_3 =$ | 1.417 |
|---|---|---|
| (8) | $(\phi_B^{1/2} - 4 \cdot dW \cdot NA_i)/(f_3 \cdot NA_i^2) =$ | 3.244 |
| (9) | $f_2/f_1 =$ | -0.789 |

Figure 4A:
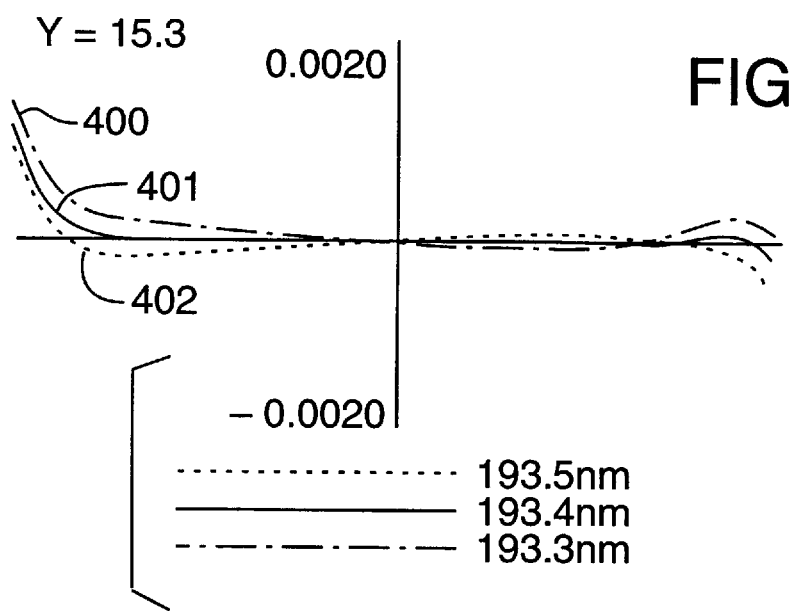
FIG. 4(a) contains graphs of transverse aberrations for an object point 15.3 mm from an axis of the catadioptric system of Example Embodiment 2, plotted for wavelengths of 193.3 nm, 193.4 nm, and 194.5 mm.
Figure 4B:
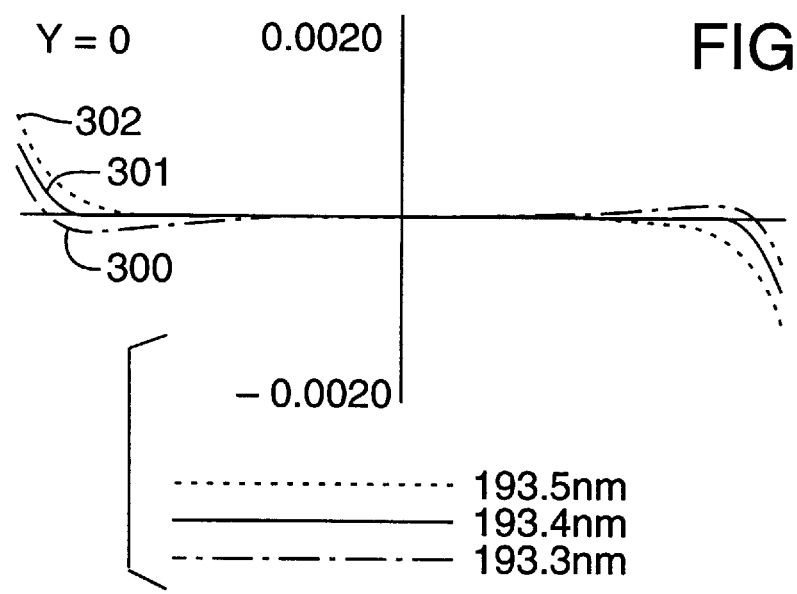
FIG. 4(b) contains graphs of transverse aberrations for an on-axis object point for the catadioptric system of Example Embodiment 2, plotted for wavelengths of 193.3 nm, 193.4 nm, and 193.5 nm.

FIG. 4(b) depicts transverse aberration curves 300, 301, 302 for an on-axis image point and FIG. 4(a) depicts transverse aberration curves 400, 401, 402 for an image point at Y=15.3 mm from the axis, plotted at wavelengths of 193.3 nm, 193.4 nm, and 193.5 nm, respectively. It is readily apparent that the aberrations of the catadioptric system of Example Embodiment 2 are well-corrected even though the catadioptric system has an image-side numerical aperture $NA_i$=0.6 and a long working distance. In particular, chromatic aberration is well-corrected within the wavelength range 193.4 nm±0.1 nm.

The catadioptric systems of the Example Embodiments are both object-side and image-side telecentric. In telecentric systems, chief rays from an object intersect on the axis. With telecentric systems, the plane perpendicular to the axis and containing the intersection of the chief rays is called a Fourier transform plane. In the Example Embodiments, spatial filters can be placed in Fourier transform planes of the catadioptric systems. The radial distance at which light strikes a Fourier transform plane depends on the angle of diffraction of the light. More highly diffracted light is more radially distant from the axis. Generally, optical systems for photolithography use 0th and 1st order diffracted light.

Figure 5A:
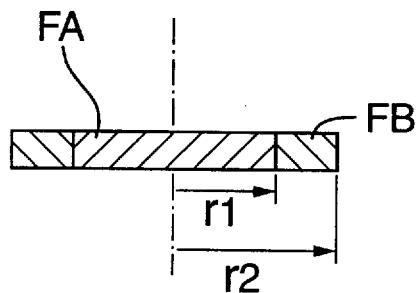
FIGS. 5(a)–5(c) depict various features of a spatial filter usable for increasing depth of focus of the catadioptric systems of Example Embodiments 1 and 2.
Figure 5B:
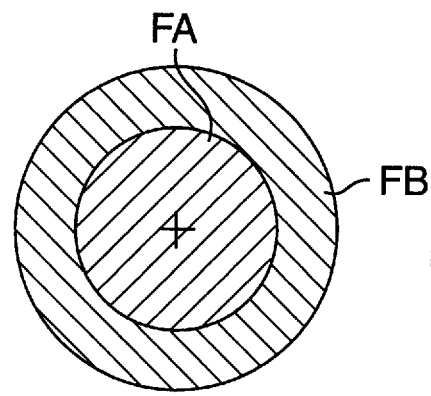

By substituting spatial filters for the aperture AS, depth of focus of the catadioptric systems of the invention increase. An exemplary spatial filter is described with reference to FIGS. 5(a)–5(c). IN FIGS. 5(a)–5(b), a spatial filter SF is divided into a center region FA close to the axis and having a radius $r_1$, and a perimeter region FB more distant from the axis AX and having a radius $r_2$. The region FA receives 0th-order diffracted light while 1st-order diffracted light is incident on the region FB.

Figure 5C:
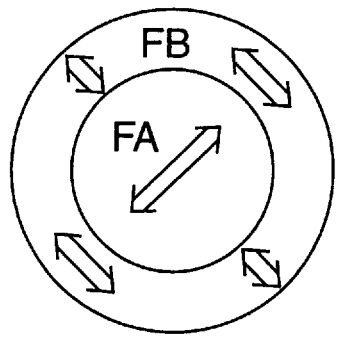

With reference to FIG. 5(c), the regions FA and FB are polarizing regions transmitting orthogonal polarizations. In addition, the refractive index of the center region FA is lower than the refractive index of the perimeter region FB. The catadioptric system forms an image of the mask M on the wafer W with the light flux transmitted by the perimeter region FB as usual. Because the refractive index of the center region FA is low, this light flux focuses farther along the axis than a normal focal point. The light flux transmitted by the perimeter region FB and the center region FA are orthogonally polarized and do not interfere. This makes it possible to increase the depth of focus.

Other techniques for increasing depth of focus are available such as those disclosed in Japanese published patent documents 61-91662 (1986), 5-234850 (1993), 6-120110 (1994), 6-124870 (1994), 7-57992 (1995), and 7-57993 (1995). The techniques disclosed can be applied to the catadioptric systems of this invention. In particular, such techniques are especially effective when projecting isolated patterns.

Having illustrated and demonstrated the principles of the invention, it should be apparent to those skilled in the art that the Example Embodiments can be modified in arrangement and detail without departing from such principles. I claim as the invention all that comes within the scope of these claims.

What is claimed is:

1. A catadioptric system for projecting an image of an object onto a substrate, the system comprising, from objectwise to imagewise along an axis:

(a) a first lens group having positive power and receiving a light flux from the object;

(b) a second lens group having negative power that transmits the light flux received from the first lens group;

(c) a beamsplitter that receives the light flux from the second lens group;

(d) a concave mirror having a magnification $\beta_{CM}$ that receives the light flux from the beamsplitter;

(e) a third lens group with positive power and with a most objectwise principal point that is imagewise of a most objectwise surface of the third lens group, wherein the third lens group receives the light flux reflected by the concave mirror and directed to the third lens group by the beamsplitter and forms the image of the object on the substrate; and (f) the catadioptric system satisfying the conditional expression:

$$1.5 < L_1 < f_3,$$

wherein $L_1$ is an axial distance between the most objectwise principal point of the third lens group and a most objectwise surface of the third lens group, and $f_3$ is a focal length of the third lens group.

2. The catadioptric system of claim 1, further satisfying the conditional expression:

$$-20.0 < \beta_1/\beta < -1.0,$$

wherein $\beta$ is a magnification of the catadioptric system and $\beta_1$ is a magnification of the first lens group.

3. The catadioptric system of claim 1, further satisfying the conditional expression:

$$-1.0 < \beta_3/\beta < 1.0,$$

wherein $\beta$ is a magnification of the catadioptric system, and $\beta_3$ is a magnification of the third lens group.

4. The catadioptric system of claim 1, further satisfying the conditional expressions:

$$-1.0 < 1/\beta_{CM} < 0.5,$$

and $$5.0 < D_{12}/(NA_i \cdot Y_0) < 50.0,$$

wherein $\beta_{CM}$ is a magnification of the concave mirror, $D_{12}$ is an axial distance between a most imagewise surface of the first lens group and a most objectwise surface of the second lens group, $NA_i$ is an image-side numerical aperture, and $Y_0$ is a maximum object height.

5. The catadioptric system of claim 2, further satisfying the conditional expression:

$$-1.0 < \beta_3/\beta < 1.0,$$

wherein $\beta$ is a magnification of the catadioptric system, and $\beta_3$ is a magnification of the third lens group.

6. The catadioptric system of claim 4, further satisfying the conditional expression:

$$-20.0 < \beta_1/\beta < -1.0,$$

wherein $\beta$ is a magnification of the catadioptric system, and $\beta_1$ is a magnification of the first lens group.

7. The catadioptric system of claim 6, further satisfying the conditional expression:

$$-1.0<\beta_3/\beta<1.0,$$

wherein β is a magnification of the catadioptric system, and $\beta_3$ is a magnification of the third lens group.

8. The catadioptric system of claim 1, wherein the beamsplitter comprises a beamsplitter cube.

9. The catadioptric system of claim 8, further comprising an aperture stop placed between a most imagewise surface of the beamsplitter cube and the image, the catadioptric system further satisfying the conditional expression:

$$0.26<T_1/f_{CM}<1.0,$$

wherein $T_1$ is an air-equivalent axial distance between the concave mirror and the aperture, and $f_{CM}$ is a focal length of the concave mirror.

10. The catadioptric system of claim 7, wherein the beamsplitter comprises a beamsplitter cube.

11. The catadioptric system of claim 10, further comprising an aperture stop placed between a most imagewise surface of the beamsplitter cube and the image, the catadioptric system further satisfying the conditional expression:

$$0.26<T_1/f_{CM}<1.0,$$

wherein $T_2$ is an air-equivalent axial distance between the concave mirror and the aperture, and $f_{CM}$ is a focal length of the concave mirror.

12. The catadioptric system of claim 2, further satisfying the conditional expression:

$$0.7<(T_2 \cdot NA_i)/f_3,$$

wherein $T_2$ is an air-equivalent axial distance between a most imagewise surface of the beamsplitter and the image surface, and $NA_i$ is an image-side numerical aperture of the catadioptric system.

13. The catadioptric system of claim 8, further satisfying the conditional expression:

$$0.7<(T_2 \cdot NA_i)/f_3,$$

wherein $T_2$ is an air-equivalent axial distance between a most imagewise surface of the beamsplitter and the image surface, and $NA_i$ is an image-side numerical aperture of the catadioptric system.

14. The catadioptric system of claim 8, wherein the beamsplitter cube comprises a most imagewise surface and a partially reflecting surface, the catadioptric system satisfying the conditional expression:

$$(\phi_B^{1/2}-4 \cdot d_w \cdot NA_i)/(f_3 \cdot NA_i^2)<4.0,$$

wherein $\phi_B$ is an area represented by an orthographic projection, onto the partially reflecting surface of the beamsplitter BS, of the beamsplitter's most imagewise surface that is illuminated by the light flux, and $d_w$ is an axial distance between a most imagewise surface of the third lens group and the image.

15. The catadioptric system of claim 11, wherein the beamsplitter cube comprises a most imagewise surface and a partially reflecting surface, the catadioptric system satisfying the conditional expression:

$$(\phi_B^{1/2}-4 \cdot d_w \cdot NA_i)/_3NA_i^2)<4.0,$$

wherein $\phi_B$ is an area represented by an orthographic projection, onto the partially reflecting surface of the beamsplitter BS, of the beamsplitter's most imagewise surface that is illuminated by the light flux, and $d_w$ is an axial distance between a most imagewise surface of the third lens group and the image.

16. The catadioptric system of claim 1, further satisfying the conditional expression:

$$-2.0<f_2/f_1<-0.2,$$

wherein $f_1$ is a focal length of the first lens group, and $f_2$ is a focal length of the second lens group.

17. The catadioptric system of claim 11, further satisfying the conditional expression:

$$-2.0<f_2/f_1<-0.2,$$

wherein $f_1$ is a focal length of the first lens group, and $f_2$ is a focal length of the second lens group.

18. The catadioptric system of claim 1, wherein a refractive power of all optical elements between the beamsplitter and the concave mirror is zero.

19. A catadioptric system for projecting an image of an object onto a substrate, the system comprising, from objectwise to imagewise along an axis:

(a) a first lens group that receives a light flux from the object, the first lens group having positive power, a focal length $f_1$, and a magnification $\beta_1$;

(b) a planar folding mirror that reflects the light flux received from the first lens group;

(c) a second lens group that transmits the light flux from the planar folding mirror, the second lens group having negative power and a focal length $f_2$;

(d) a beamsplitter that receives the light flux from the second lens group and comprises a partially reflecting surface and a most imagewise surface;

(e) a concave mirror that receives the light flux from the beamsplitter, the concave mirror having a magnification $\beta_{CM}$ and a focal length $f_{CM}$, wherein all optical elements between the beamsplitter and the concave mirror have a combined refractive power of zero;

(f) an aperture stop situated between a most imagewise surface of the beamsplitter and the image;

(g) a third lens group having positive power, a focal length $f_3$, a magnification $\beta_3$, and a most objectwise principal point that is imagewise of a most objectwise surface of the third lens group, the third lens group receiving the light flux reflected by the concave mirror and directed to the third lens group by the beamsplitter and forming the image of the object on the substrate in a plane parallel to the object;

(h) the catadioptric system satisfying the conditional expressions:

$$0.26<T_1/f_{CM}<1.0$$

$$1.5<L_1<f_3$$

$$-20.0<\beta_1/\beta<-1.0$$

$$-1.0<\beta_3/\beta<1.0$$

$$-1.0<1/\beta_{CM}<0.5$$

$$5.0<D_{12}/(NA_i \cdot Y_0)<50.0$$

$$0.7<(T_2 \cdot NA_i)/f_3$$

$$(\phi_B^{1/2}-4 \cdot d_w \cdot NA_i)/(f_3 \cdot NA_i^2)<4.0$$

$$-2.0<f_2/f_1<-0.2$$

wherein $T_1$ is an air-equivalent axial distance between the concave mirror and the aperture stop; $L_1$ is an axial distance between the most objectwise principal point of the third lens group and a most objectwise surface of the third lens group; $\beta$ is a magnification of the catadioptric system; $D_{12}$ is an axial distance between the first lens group and the second lens group; $NA_i$ is an image-side numerical aperture; $Y_0$ is a maximum image height; $T_2$ is an air-equivalent axial distance between a most imagewise surface of the beamsplitter and the image surface; $\phi_B$ is an area represented by an orthographic projection, onto the partially reflecting surface of the beamsplitter BS, of the beamsplitter's most imagewise surface that is illuminated by the light flux; and $d_w$ is an axial distance between a most imagewise surface of the third lens group and the image.

20. The catadioptric system of claim 19, further comprising a spatial filter located in a Fourier transform plane of the catadioptric system.

* * * * *

UNITED STATES PATENT AND TRADEMARK OFFICE
CERTIFICATE OF CORRECTION

PATENT NO. : 5,771,125

DATED : June 23, 1998

INVENTOR(S) : Toshiro Ishiyama

It is certified that error appears in the above-indentified patent and that said Letters Patent is hereby corrected as shown below:

Column 2, line 50, "$(\phi_B^{1/2} - 4 \cdot d_w \cdot NA_i)/f_3 \cdot NA_i^2) < 4.0$" should be --$(\phi_B^{1/2} - 4 \cdot d_w \cdot NA_i)/(f_3 \cdot NA_i^2) < 4.0$--.

Column 3, line 27, "194.5 mm" should be --193.5 nm--.

Column 3, line 38, "194.5 mm" should be --193.5 nm--.

Column 6, line 3, "expression 4" should be --expression 5--.

Column 11, line 42, insert --is-- after "PP2" and before "used".

In the Claims:

Column 14, line 21, claim 1, "$1.5 < L_i < f_3$" should be --$1.5 < L_1 < f_3$--.

Column 15, line 16, claim 9, "$T_i$ is" should be --$T_1$ is--.

Column 15, line 26, claim 11, "$0.26 < T_1/f_{CM} < 1.0$" should be --$0.26 < T_1/f_{CM} < 1.0$--.

Column 15, line 27, claim 11, "$T_2$" should be --$T_1$--.

UNITED STATES PATENT AND TRADEMARK OFFICE
CERTIFICATE OF CORRECTION

PATENT NO. : 5,771,125

DATED : June 23, 1998

INVENTOR(S) : Toshiro Ishiyama

It is certified that error appears in the above-indentified patent and that said Letters Patent is hereby corrected as shown below:

Column 15, line 52, claim 14, "$(\phi_B^{1/2} - 4 \cdot d_w \cdot NA_i)/(f_3 \cdot NA_1^2) < 4.0$" should be --$(\phi_B^{1/2} - 4 \cdot d_w \cdot NA_i)/(f_3 \cdot NA_i^2) < 4.0$--.

Column 15, line 64, claim 15, "$(\phi_B^{1/2} - 4 \cdot d_w \cdot NA_i)/f_3 NA_i^2) < 4.0$" should be --$(\phi_B^{1/2} - 4 \cdot d_w \cdot NA_i)/(f_3 \cdot NA_i^2) < 4.0$--.

Column 16, line 64, "$0.7 < (T_2 \cdot NA_i)f_3$" should be --$0.7 < (T_2 \cdot NA_i)/f_3$--.

Signed and Sealed this

Twenty-sixth Day of October, 1999

Attest:

Q. TODD DICKINSON

*Attesting Officer*     *Acting Commissioner of Patents and Trademarks*